United States Patent [19]
Merrill

[11] Patent Number: 5,892,541
[45] Date of Patent: Apr. 6, 1999

[54] IMAGING SYSTEM AND METHOD FOR INCREASING THE DYNAMIC RANGE OF AN ARRAY OF ACTIVE PIXEL SENSOR CELLS

[75] Inventor: Richard Billings Merrill, Daly City, Calif.

[73] Assignee: Foveonics, Inc., Cupertino, Calif.

[21] Appl. No.: 711,983

[22] Filed: Sep. 10, 1996

[51] Int. Cl.[6] ................................................... H04N 3/14
[52] U.S. Cl. ........................................ 348/302; 348/304
[58] Field of Search .................................. 348/302, 304, 348/308, 297, 307, 301, 300, 296, 298, 312, 322, 164; 257/229, 230, 249

[56] References Cited

U.S. PATENT DOCUMENTS

| | | | |
|---|---|---|---|
| 4,335,405 | 6/1982 | Sakane et al. | 348/297 |
| 4,734,583 | 3/1988 | Wang et al. | 348/164 |
| 5,144,447 | 9/1992 | Akimoto et al. | 348/301 |
| 5,541,654 | 7/1996 | Roberts | 348/302 |
| 5,608,243 | 3/1997 | Chi et al. | 257/249 |
| 8,707,933 | 9/1996 | Merrill et al. | |

OTHER PUBLICATIONS

Dickinson, A. et al., "TP 13.5: A 256x256 CMOS Active Pixel Image Sensor with Motion Detection," 1995 IEEE/International Solid-State Circuits Conference, pp. 226–227.

Agwani, S. et al., "A High Speed, Dual Output Channel, Stage Selectable, TDI CCD Image Sensor for High Resolution Applications," pp. 124–133, SPIE, vol. 2415, Sep., 1995.

Delbrück, T. et al., "Analog VLSI Phototransduction by continuous–time, adaptive, logarithmic photoreceptor circuits," pp. 1–24, Calif. Inst. of Tech. Computation & Neural Systems Program, CNS Memo No. 30, May 11, 1994.

Delbrück, T., "Imager Circuits," Synaptics/National Imager Project, Test Imager Circuit Documentation, pp. 1–8, Aug. 23, 1995.

IMEC VZW, "Fuga data sheet", p. 26, Leuven, Belgium, Aug. 30, 1995.

Primary Examiner—Wendy Garber
Assistant Examiner—Luong Nguyen
Attorney, Agent, or Firm—Limbach & Limbach L.L.P.

[57] ABSTRACT

The dynamic range of an imaging system that utilizes an array of active pixel sensor cells is substantially increased by reading each cell in the array multiple times during each integration period. Each time a cell is read, the number of photons collected by the cell is saved and the cell is reset if the cell would normally saturate by the end of the integration period. At the end of the integration period, the number of photons collected by each cell is defined by the sum of the values collected during the integration period.

13 Claims, 7 Drawing Sheets

IMAGING SYSTEM AND METHOD FOR INCREASING THE DYNAMIC RANGE OF AN ARRAY OF ACTIVE PIXEL SENSOR CELLS

BACKGROUND OF THE INVENTION

1. Field of the Invention.

The present invention relates to active pixel sensor cells and, more particularly, to an imaging system and method for increasing the dynamic range of an array of active pixel sensor cells.

2. Description of the Related Art.

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photodiode is typically combined with a number of active transistors which, in addition to forming an electrical signal, provide amplification, readout control, and reset control.

Figure 1:
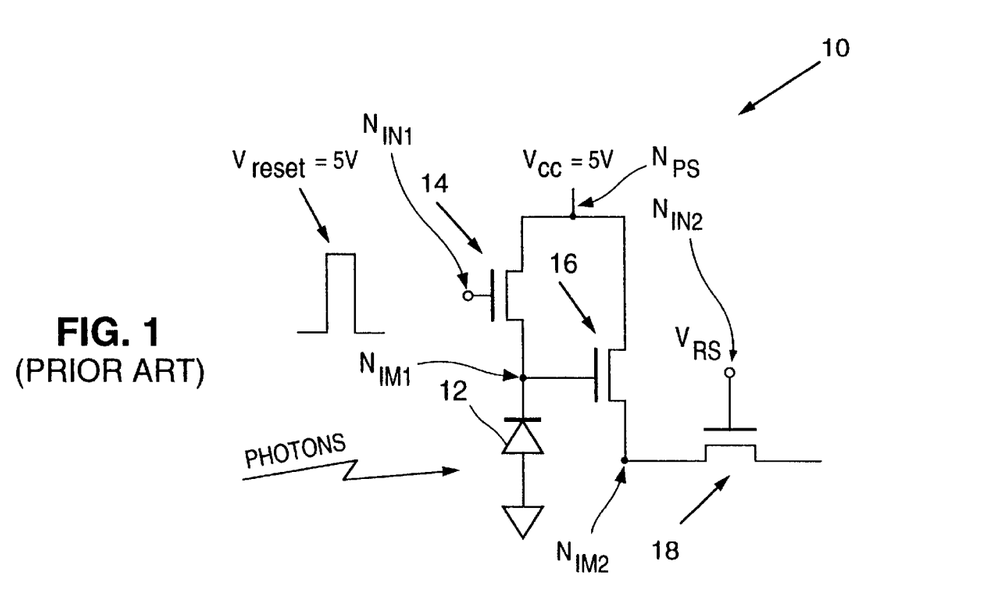
FIG. 1 is a schematic diagram illustrating a conventional active pixel sensor cell 10.

FIG. 1 shows an example of a conventional CMOS active pixel sensor cell 10. As shown in FIG. 1, cell 10 includes a photodiode 12, a reset transistor 14, whose source is connected to photodiode 12, a buffer transistor 16, whose gate is connected to photodiode 12, and a select transistor 18, whose drain is connected in series to the source of buffer transistor 16.

Operation of active pixel sensor cell 10 is performed in three steps: a reset step, where cell 10 is reset from the previous integration cycle; an image integration step, where the light energy is collected and converted into an electrical signal; and a signal readout step, where the signal is read out.

As shown in FIG. 1, during the reset step, the gate of reset transistor 14 is briefly pulsed with a reset voltage (5 volts) which resets photodiode 12 to an initial integration voltage which is approximately equal to the voltage on the drain of transistor 14 less the threshold voltage of transistor 14.

During integration, light energy, in the form of photons, strikes photodiode 12, thereby creating a number of electron-hole pairs. Photodiode 12 is designed to limit recombination between the newly formed electron-hole pairs. As a result, the photogenerated holes are attracted to the ground terminal of photodiode 12, while the photogenerated electrons are attracted to the positive terminal of photodiode 12 where each additional electron reduces the voltage on photodiode 12.

Thus, at the end of the integration period, the number of photons which were absorbed by photodiode 12 during the image integration period can be determined by subtracting the voltage at the end of the integration period from the voltage at the beginning of the integration period.

Following the image integration period, active pixel sensor cell 10 is read out by turning on select transistor 18. At this point, the reduced voltage on photodiode 12, less the threshold voltage of buffer transistor 16, is present on the source of buffer transistor 16. When select transistor 18 is turned on, the voltage on the source of buffer transistor 16 is then transferred to the source of select transistor 18. The reduced voltage on the source of select transistor 18 is detected by conventional detection circuitry.

One problem with active pixel sensor cell 10, however, is that imaging systems which utilize an array of active pixel sensor cells suffer from a limited dynamic range. Conventionally, the dynamic range is defined by the maximum number of photons that a cell 10 can collect during an integration period without saturating (exceeding the capacity of) the cell 10, and the minimum number of photons that a cell 10 can collect during the integration period that can be detected over the noise floor.

The effect of a limited dynamic range is most pronounced in images that contain both bright-light and low-light sources. In these situations, if the integration period of the array is shorted to the point where none of the bright-light information is lost, i.e., where the number of collected photons will not exceed the capacity of the cell during the integration period, then most, if not all, of the low-light information will be lost (resulting in a black image) because the collected photons will not be distinguishable over the noise level.

On the other hand, if the integration period of the array is increased to capture the low-light information, i.e., where the number of collected photons is detectable over the noise floor, then a significant portion of the bright-light information is lost (resulting in a white image) because the number of collected photons will far exceed the capacity of the cell.

One approach to solving the problem of dynamic range is to utilize a non-integrating active pixel sensor cell with a non-linear load device, such as a MOSFET-diode in weak inversion, to obtain a logarithmic response. This approach, however, has a number of drawbacks.

First, the noise in a non-integrating cell is much higher than the noise in a conventional integrating cell (such as cell 10 of FIG. 1). In a conventional integrating cell, the effect of random noise events is averaged over the integration period, while the effect of random noise events in a non-integrating cell can produce substantial distortions. Second, the exact non-linear transfer function of this type of device must be carefully calibrated to avoid variations from cell to cell and due to temperature changes.

Another approach to solving the problem of dynamic range, which is used with CCD systems, is to integrate twice: once with a short exposure and once with a long exposure. For the short exposure, the bright-light information is saved while the low-light information is discarded. Similarly, for the long exposure, the low-light information is saved while the bright-light information is discarded.

The information from the two exposures is then combined to form a composite image. The drawback with this approach, however, is that the resulting image is formed by combining image data from two different periods of time.

Thus, to successfully capture both bright-light and low-light sources in the same image, there is a need for an imaging array of active pixel sensor cells with a substantially increased dynamic range.

SUMMARY OF THE INVENTION

Conventionally, the dynamic range of an imaging system that utilizes an array of active pixel sensor cells is defined by the maximum number of photons that a cell can collect during an integration period without saturating (exceeding the capacity of) the cell, and the minimum number of photons that a cell can collect during the integration period that can be detected over the noise floor. The present invention, however, significantly extends the dynamic range of imaging systems by reading each cell in the array multiple times during each integration period.

An imaging system in accordance with the present invention includes an array of active pixel sensor cells arranged in rows and columns, a plurality of detection circuits that correspond to the number of columns in the array, and an array controller and memory unit.

The imaging system also includes a series of row select lines, a series of cell output lines, and a series of detection output lines. The row select lines are output from the array controller and memory unit to the cells of the array so that each row select line is connected to each of the cells in a row of active pixel sensor cells.

The series of cell output lines are output from the active pixel sensor cells to the detection circuits so that each cell output line is connected to each of the cells in a column of cells and to a detection circuit that corresponds with the column of cells. The series of detection output lines are output from the detection circuits to the array controller and memory unit.

In accordance with the present invention, the imaging system further includes a series of row reset lines which are output from the array controller and memory unit to the cells of the array so that each row reset line is connected to each of the active pixel sensor cells in a row of cells, and a series of column reset lines which are output from the array controller and memory unit to the cells so that each column reset line is connected to each of the active pixel sensor cells in a column of cells.

The series of row and column reset lines allow each cell in the array to be individually reset so that cells which are exposed to light sources which would normally saturate a cell can be read and reset multiple times during each integration period.

Operation of the imaging system of the present invention begins by first resetting each of the active pixel sensor cells in the array. Following this, photons are collected in each of the cells of the array during an integration period that begins after the cells have been initially reset.

During the integration period, each cell is read n times to determine how many photons have been collected in the cell since the cell was last reset. During each of the first n−1 times that each cell is read, the number of photons collected by the cell is compared to a predetermined number.

If the number of photons collected by a cell is equal to or greater than the predetermined number, the number of collected photons is stored and the cell is reset. If the number of photons collected by a cell is less than the predetermined number, the number is disregarded.

When a cell is read for the nth time, the number of photons collected by the cell is combined with any stored number of photons previously collected by the cell to obtain a total number of photons collected by the cell during the integration period. The total number of photons collected by each cell in the array is then output.

Thus, the cells in the array which have been reset n−1 times since the initial reset will collect photons over each of n collection periods of the integration period, while the cells which have never been reset since the initial reset will collect photons over the entire integration period.

A better understanding of the features and advantages of the present invention will be obtained by reference to the following detailed description and accompanying drawings which set forth an illustrative embodiment in which the principals of the invention are utilized.

DETAILED DESCRIPTION

Figure 2:
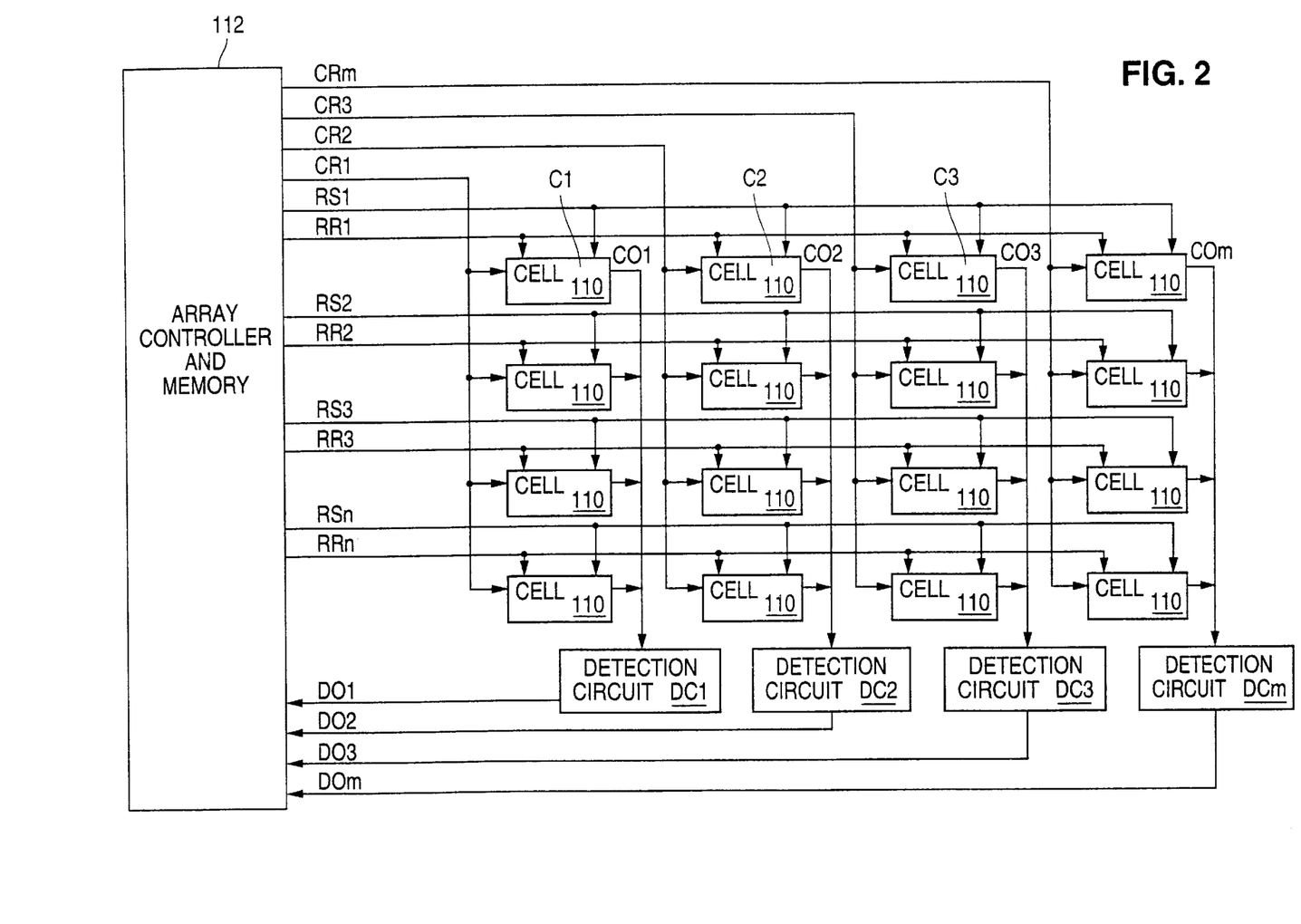
FIG. 2 is a schematic drawing illustrating an imaging system 100 in accordance with the present invention.

FIG. 2 shows a schematic drawing that illustrates an imaging system 100 in accordance with the present invention. As described in greater detail below, the present invention significantly increases the dynamic range of imaging systems by sampling the image cells multiple times during each integration cycle.

As shown in FIG. 2, imaging system 100 includes an array of active pixel sensor cells 110 arranged in rows and columns, a series of detection circuits DC1–DCm that correspond to the number of columns, and an array controller and memory unit 112.

As further shown in FIG. 2, imaging system 100 also includes a series of row select lines RS1–RSn, a series of cell output lines CO1–COm, and a series of detection output lines DO1–DOm. The row select lines RS1–RSn, which correspond to the number of rows of cells, are output from unit 112 to the cells 110 so that each row select line RS is connected to each of the cells 110 in a row of active pixel sensor cells.

The series of cell output lines CO1–COm, which correspond to the number of columns of cells, are output from the active pixel sensor cells 110 to the detection circuits DC1–DCm so that each cell output line CO is connected to each of the cells 110 in a column of cells and to a detection circuit DC1–DCm that corresponds with the column of cells 110. The series of detection output lines DO1–DOm, in turn, are output from the detection circuits DC1–DCm to array controller and memory unit 112.

In accordance with the present invention, imaging system 100 further includes a series of row reset lines RR1–RRn which are output from unit 112 to the cells 110 so that each row reset line RR is connected to each of the active pixel sensor cells 110 in a row of cells, and a series of column reset lines CR1–CRm which are output from unit 112 to the cells 110 so that each column reset line CR is connected to each of the active pixel sensor cells 110 in a column of cells.

Figure 3:
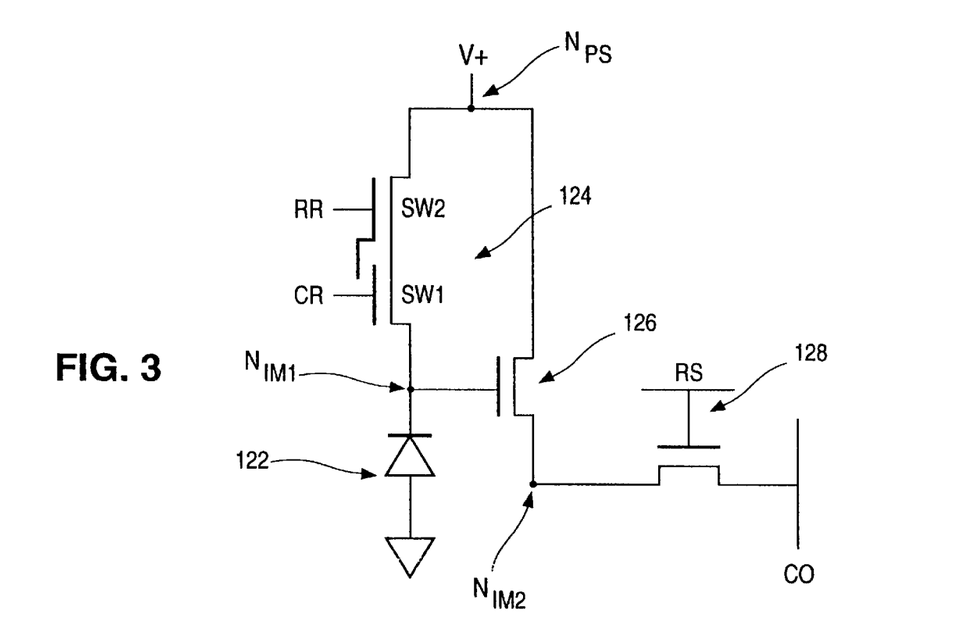
FIG. 3 is a schematic drawing illustrating an active pixel sensor cells 110 in accordance with the present invention.
Figures 4A, 4B:
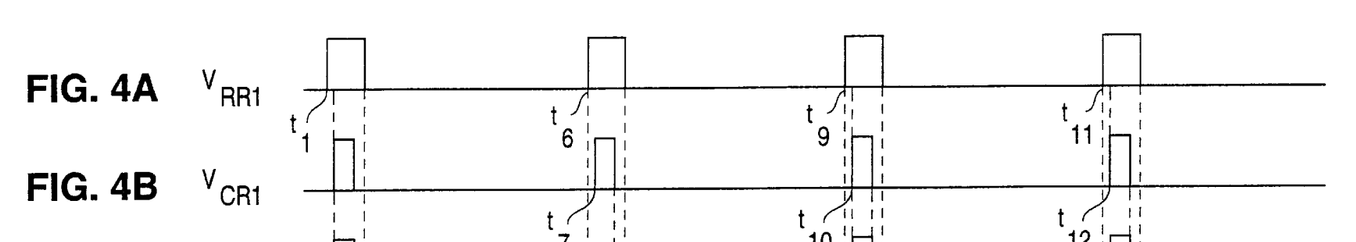
FIGS. 4A–4E are timing diagrams illustrating the operation of imaging system 100 with respect to the cells 110 in the first row of the array in accordance with the present invention.
Figures 4C, 4D, 4E:
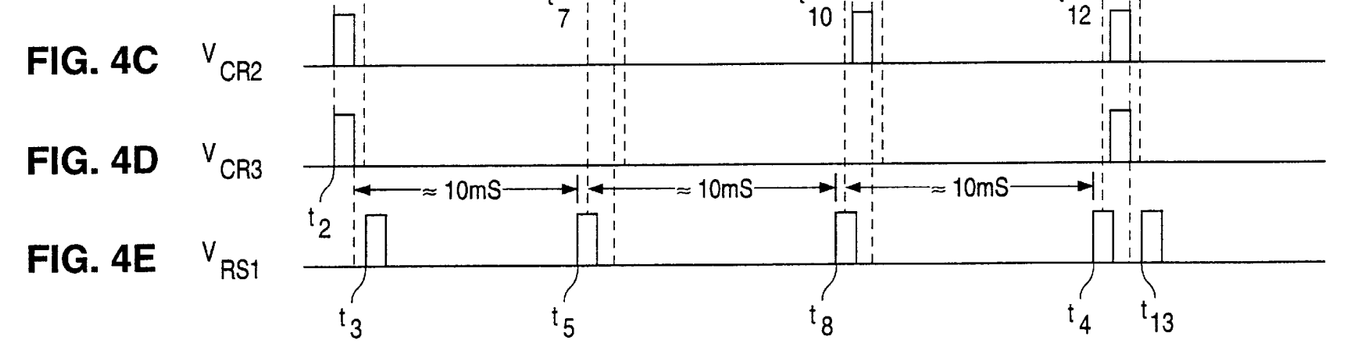

The series of row and column reset lines RR1–RRn and CR1–CRm allow each cell 110 in the array to be individually reset so that cells which are exposed to light sources which would normally saturate a cell can be read and reset multiple times during each integration period. FIG. 3 shows a schematic drawing that illustrates an active pixel sensor cell 110 in accordance with the present invention.

As shown in FIG. 3, cell 110 includes a photo-diode 122 connected to a first intermediate node $N_{IM1}$, and a split-gate reset transistor 124 that has a drain connected to a power supply node $N_{PS}$, a source connected to node $N_{IM1}$, a first gate SW1 connected to a column reset line CR, and a second gate SW2 connected to a row reset line RR. The advantage of using a split-gate reset transistor is that each cell 110 in the array can be individually reset without resetting other cells 110 in the same row or column.

Cell 110 further includes a buffer transistor 126 and a row-select transistor 128. Buffer transistor 116 has a drain connected to node $N_{PS}$, a source connected to a second intermediate node $N_{IM2}$, and a gate connected to node $N_{IM1}$, while row-select transistor 128 has a drain connected to node $N_{IM2}$, a source connected to a column output lines CO, and a gate connected to a row-select line RS.

FIGS. 4A–4E show timing diagrams that illustrate the operation of imaging system 100 with respect to the cells 110 in the first row of the array in accordance with the present invention. As shown in FIGS. 2, 3, and 4A–4E, operation of an integration cycle begins with unit 112 first resetting the cells 110 in the first row of the array by applying a row reset voltage $V_{RR1}$ to row reset line RR1 at time $t_1$, followed by the substantially simultaneous application of a series of column reset voltages $V_{CR1}$–$V_{CRM}$ to the column reset lines CR1–CRm, respectively, at time $t_2$. (To avoid charge loss, the present invention preferably maintains the row reset voltage $V_{RR1}$ on switch SW2 until the column reset voltage $V_{CR1}$ on switch SW1 has been deasserted).

The row reset voltage $V_{RR1}$ applied to row reset line RR1, which is connected to each of the second gates SW2 of the split-gate reset transistors 124 in the first row, causes first portions of the channels of each of the split-gate reset transistors 124 to invert.

Similarly, the series of column reset voltages $V_{CR1}$–$V_{CRm}$ applied to the column reset lines CR1–CRm, which are connected to each of the first gates SW1 of the split-gate reset transistors 124 in the first row, causes the remainder of the channels of each of the split-gate reset transistors 124 to invert, thereby causing each of the split-gate reset transistors 124 to become conductive. Once conductive, the split-gate reset transistors 124 pull up the voltages on the photodiodes 122 to an initial integration voltage, thereby ending the reset step.

After the voltages on the cells 110 in the first row have been reset, unit 112 repeats the above-described steps for each of the rows in the array until all of the cells 110 in the array have been reset. Thus, imaging system 100 begins an image collection cycle by resetting each of the active pixel sensor cells 110 in the array to an initial integration voltage.

Once each of the cells 110 in the array have been reset to an initial integration voltage, imaging system 100 next determines the value of the initial integration voltage on each of the cells 110 (due to variations in the threshold voltages of the buffer transistors 126).

As shown in FIGS. 2, 3, and 4A–4E, unit 112 determines the initial integration voltage on each of the cells 110 in the first row by applying a row select voltage $V_{RS1}$ to row select line RS1 at a time $t_3$, which occurs immediately after the falling edge of the column reset voltages $V_{CR1}$–$V_{CRm}$.

The row select voltage $V_{RS1}$ applied to row select line RS1, which is connected to each of the gates of the row select transistors 128 in the first row, causes the voltages on the second intermediate nodes $N_{IM2}$ of the cells 110, which represent the initial integration voltages of the cycle, to appear on the cell output lines CO1–COm.

The detection circuits DC1–DCm then amplify and digitize the initial integration voltages on the cell output lines CO1–COm. The digitized initial integration voltages are then output on the detection output lines DO1–DOm to unit 112 which stores the digitized initial integration voltage of each cell 110 in the first row.

Once the initial integration voltage on each of the cells 110 in the first row has been determined and stored, unit 112 repeats the above-described steps for each of the rows in the array until the initial integration voltages on all of the cells 110 in the array have been determined and stored.

After the initial integration voltages on all of the cells 110 in the array have been determined and stored, imaging system 100 begins collecting photons in each of the active pixel sensor cells 110 in the array.

As shown in FIGS. 2, 3, and 4A–4E, from time $t_3$, which represents the effective beginning of the integration cycle, to a time $t_4$, which represents the effective end of the integration cycle, light energy, in the form of photons, strikes the photodiodes 122 in the cells 110, thereby creating a number of electron-hole pairs. The photodiodes 122 are designed to limit recombination between the newly formed electron-hole pairs.

As a result, the photogenerated holes in each cell 110 are attracted to the ground terminal of the photodiode 122, while the photogenerated electrons are attracted to the positive terminal of the photodiode 122 where each additional electron reduces the voltage on the photodiode 122 and the second intermediate node $N_{IM2}$ of each cell 110.

Next, in accordance with the present invention, rather than determining the voltages on the photodiodes 122 of the cells 110 (via the second intermediate nodes $N_{IM2}$) at the end of the integration cycle, as is conventionally the case, the present invention determines the voltages on each photodiode 122 multiple times during each integration cycle.

Thus, in the present invention, each cell 110 is read n times during each integration cycle to determine how many photons have been collected in the cell since the cell was last reset. As a result, n photon values are calculated for each cell 110 in the array where each photon value represents how many photons have been collected in a cell 110 since the cell 110 was last reset.

For digital still cameras, the maximum integration period (image collection period) is defined by the f-stop of the camera. For example, a shutter speed of 1/50 of a second means that the maximum integration period is defined to be approximately 20 mS. On the other hand, the maximum integration period for video cameras is defined by the scan rates of the camera to be approximately 30 mS. The maximum integration period, in turn, defines the lowest light level which can be captured by the camera.

The number of collection periods within each integration period can be set to be any number, but is preferably set to be the minimum number of periods that can be used to prevent a cell exposed to the brightest light from becoming saturated. The advantage of preventing a cell from becoming saturated is that no image information is lost. The advantage of using the minimum number of integration periods is that less noise is accumulated.

Figure 5:
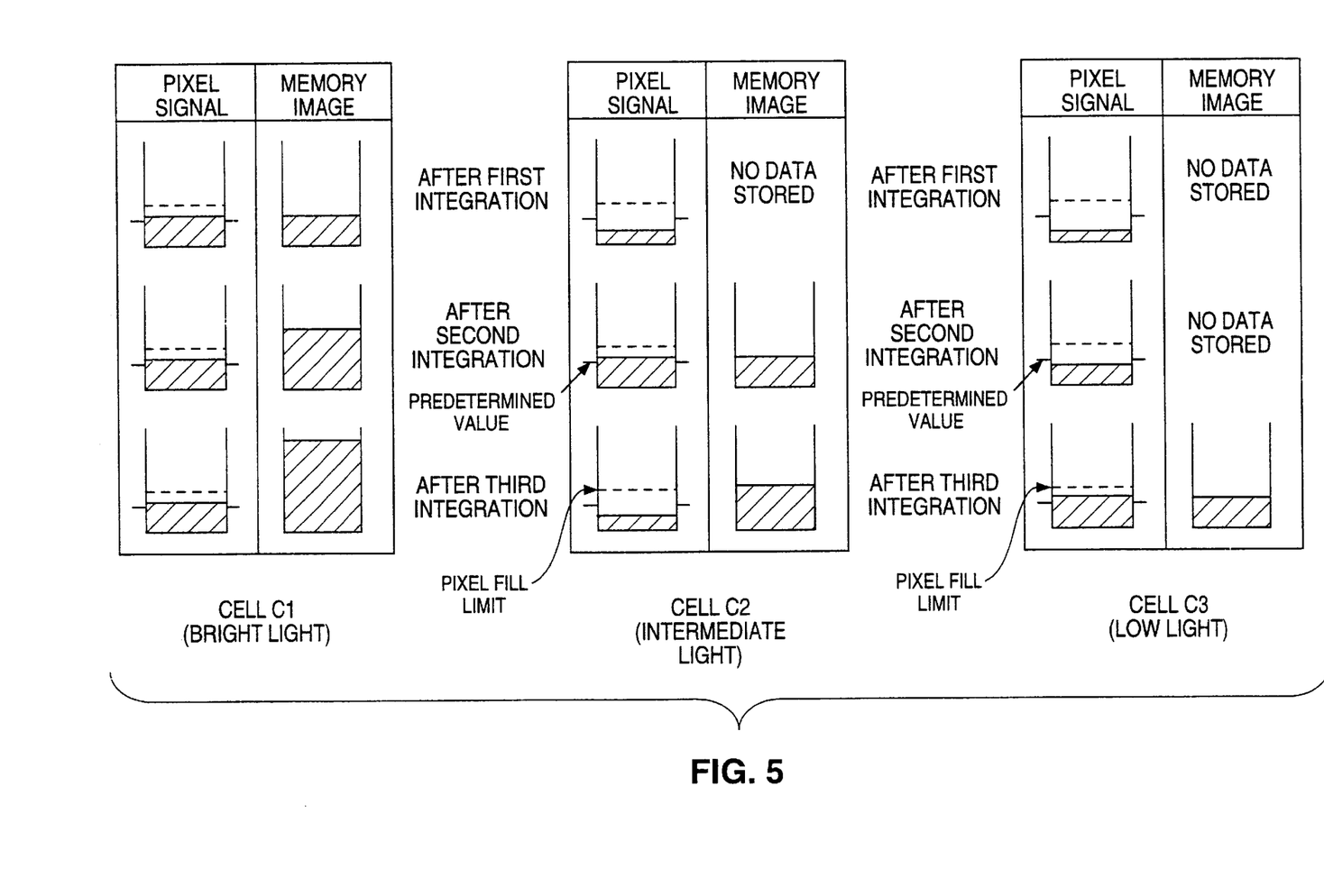
FIG. 5 is a pictorial representation illustrating the operation of system 100 in a video context with respect to cell C1 of FIG. 2, which is exposed to bright light, cell C2 of FIG. 2, which is exposed to intermediate light, and cell C3 of FIG. 2, which is exposed to low light.
Figure 6A:
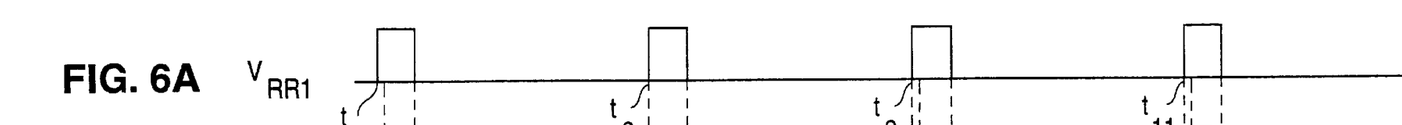
FIGS. 6A–6E are timing diagrams illustrating an alternate operation of imaging system 100 with respect to the cells 110 in the first row of the array in accordance with the present invention.
Figure 6B:
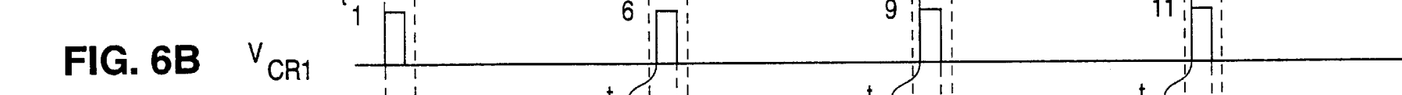
Figure 6C:
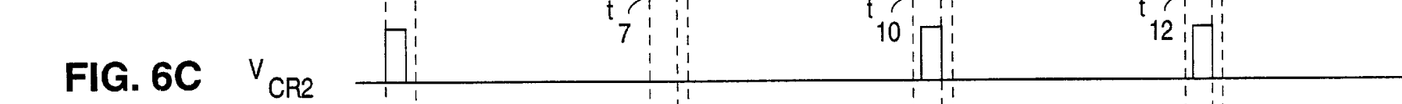
Figure 6D:
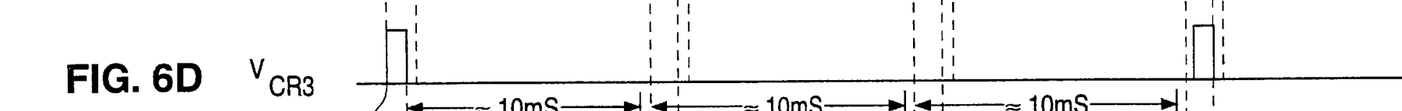
Figure 6E:
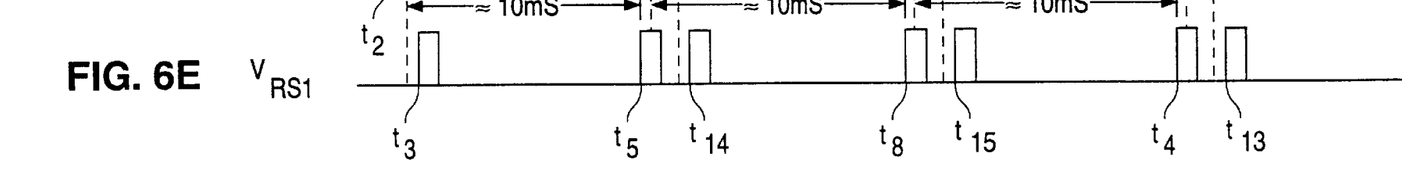

FIG. 5 shows a pictorial representation that illustrates the operation of system 100 in a video context with respect to cell C1 of FIG. 2, which is exposed to bright light, cell C2 of FIG. 2, which is exposed to intermediate light, and cell C3 of FIG. 2, which is exposed to low light.

As shown in FIGS. 4A–4E and 5, each integration cycle, which is conventionally set to be approximately 30 mS long, is subdivided into three collection periods of 10 mS. Thus, at the end of the first collection period at time $t_5$1 which is approximately 10 mS after the cells 110 have been reset, unit 112 again applies the row-select voltage $V_{RS1}$ to row-select line RS1 which, in turn, causes the voltages on each of the second intermediate nodes $N_{IM2}$ in the first row, which represent the first integration voltages of the cycle, to appear on the cell output lines CO1–COm.

The detection circuits DC1–DCm then amplify and digitize the first integration voltages on the cell output lines CO1–COm. The digitized first integration voltages for each of the cells 110 in the first row are then output on the detection output lines DO1–DOm to unit 112.

Next, unit 112 subtracts the digitized first integration voltage of each cell 110 in the first row from its digitized initial integration voltage to obtain a first collected photon value for each cell 110 in the first row. The first collected photon value, in turn, represents the number of photons that have been collected by a cell 110 during the first collection period.

Following this, unit 112 compares each first collected photon value to a predetermined value. Although any value can be used as the predetermined value, the value preferably used is one which represents approximately one-half of the maximum number of photons (the pixel fill limit) that can be collected by a cell 110.

If the first collected photon value of a cell 110 is equal to or greater than the predetermined value, then the first collected photon value is stored in unit 112. On the other hand, if the first collected photon value of a cell 110 is less than the predetermined value, then the first collected photon value is disregarded by unit 112.

Thus, as shown in FIG. 5, since cell C1 is exposed to bright light, the first collected photon value of cell C1 exceeds the predetermined value and is, therefore, stored in unit 112. On the other hand, since cells C2 and C3 are exposed to intermediate and low light, respectively, the first collected photon values of these cells are less than the predetermined value and are, therefore, disregarded.

Once the cells 110 having first collected photon values that are equal to or greater than the predetermined value have been determined, unit 112 resets these cells 110. Thus, since cell C1 is the only cell 110 in the first row with a first collected photon value equal to or greater than the predetermined value, unit 112 resets only cell C1 by first applying the row reset voltage $V_{RR1}$ to row reset line RR1 at time $t_6$, and then applying the column reset voltage $V_{CR1}$ to column reset line CR1 at time $t_7$.

None of the remaining cells 110 in the first row are reset at this time because both the row reset voltage $V_{RR}$ and the column reset voltage $V_{CR}$ must be present at the same time to reset a cell. Thus, since the column reset voltage $V_{CR1}$ is the only column voltage applied, only the cell in the first row and the first column is reset.

Once the first collected photon values for all the cells 110 in the first row have been determined, and the respective cells have been reset, unit 112 repeats the above-described steps for each of the rows in the array until the first collected photon values have been determined, and the respective cells 110 have been reset for all of the cells 110 in the array.

Following this, photon integration continues until the end of the second collection period at time $t_8$. At this point, cell C1 has been collecting photons for approximately 10 mS (since it was last reset), while cells C2 and C3 having been collecting photons for approximately 20 mS.

Thus, at time $t_8$, unit 112 again applies the row-select voltage $V_{RS1}$ to row-select line RS1 which, in turn, causes the voltages on the second intermediate nodes $N_{IM2}$, which represent the second integration voltages of the cycle, to appear on the cell output lines CO1–COm.

The detection circuits DC1–DCm then amplify and digitize the second integration voltages on the cell output lines CO1–COm. The digitized second integration voltages for each of the cells 110 in the first row are then output on the detection output lines DO1–DOm to unit 112.

Next, unit 112 again subtracts the digitized second integration voltage of each cell 110 in the first row from its digitized initial integration voltage to obtain a second collected photon value for each of the cells 110 in the first row. Following this, unit 112 compares each second collected photon value to the predetermined value.

As above, if the second collected photon value of a cell 110 is equal to or greater than the predetermined value, then the second collected photon value is stored in unit 112. On the other hand, if the second collected photon value of a cell 110 is less than the predetermined value, then the second collected photon value is disregarded by unit 112.

Thus, as shown in FIG. 5, since cell C1 is exposed to bright light, the second collected photon value of cell C1 again exceeds the predetermined value and is, therefore, stored in unit 112. In addition, although the first collected photon value of cell C2 was less than the predetermined value, the second collected photon value of cell C2, which is exposed to intermediate light, now also exceeds the predetermined value and is, therefore, stored in unit 112. On the other hand, the second collected photon value of cell C3, which is exposed low light, continues to be less than the predetermined value and is, therefore, disregarded.

In the preferred embodiment, unit 112 stores the first and second collected photon values of cell C1 as a total value, although the first and second collected photon values of cell C1 may alternately be stored in separate locations.

Once the cells 110 in the first row having second collected photon values that are equal to or greater than the predetermined value have been stored, unit 112 resets these cells. Thus, since cells C1 and C2 are the only cells in the first row with a second collected photon value equal to or greater than the predetermined value, unit 112 resets cells C1 and C2 by first applying the row reset voltage $V_{RR1}$ to row reset line RR1 at time $t_9$, and then applying the column reset voltages $V_{CR1}$ and $V_{CR2}$ to column reset lines CR1 and CR2, respectively, at time $t_{10}$. None of the remaining cells 110 in the first row are reset at this time because both the row reset voltage $V_{RR}$ and the column reset voltage $V_{CR}$ must be present at the same time to reset a cell.

Once the second collected photon values of the cells 110 in the first row have been determined, and the respective cells 110 have been reset, unit 112 repeats the above-described steps for each of the rows in the array until the second collected photon values for all of the cells 110 in the array have been determined, and the respective cells have been reset.

Following this, photon integration continues until the end of the third integration period at time $t_4$ which corresponds with the end of the integration cycle. At this point, cells C1 and C2 have been collecting photons for approximately 10 mS, while cell C3 has been collecting photons for approximately 30 mS.

At the end of the third collection period (time $t_4$), unit 112 again applies the row-select voltage $V_{RS1}$ to row-select line RS1 which, in turn, causes the voltages on the second intermediate nodes $N_{IM2}$, which represent the third integration voltages of the cycle, to appear on the cell output lines CO1–COm.

The detection circuits DC1–DCm then amplify and digitize the third integration voltages on the respective cell output lines CO1–COm. The digitized third integration voltages for each of the cells 110 in the first row are then output on the detection output lines DO1–DOm to unit 112.

Next, unit 112 subtracts the digitized third integration voltage of each cell 110 in the first row from its digitized initial integration voltage to obtain a third collected photon value for each cell 110 in the first row.

Following this, unit 112 combines the third collected photon value with the corresponding first and second stored collected photon values, where present, of each of the cells 110 in the first row to obtain a total collected photon value for each of the cells 110 in the first row. After this, unit 112 outputs the total collected photon value for each of the cells 110 in the first row.

Thus, as shown in FIG. 5, since cell C1 was exposed to bright light during each of the three collection periods, the third collected photon value is combined with the stored first and second collected photon values for cell C1 to obtain the total collected photon value for cell C1. Since cell C2 was exposed to intermediate light, the third collected photon value is combined with the stored second collected photon value for cell C2 to obtain the total collected photon value for cell C2.

On the other hand, since cell C3 was exposed to low light, no first or second collected photon values were stored for cell C3. As a result, the third collected photon value for cell C3 becomes the total collected photon value for cell C3.

Once the third collected photon values for the cells 110 in the first row have been determined, unit 112 repeats the above-described steps for each of the rows in the array until the third collected photon values for all of the cells 110 in the array have been determined.

After the third collected photon values for the cells 110 in the array have been determined, unit 112 begins the next image collection cycle by resetting each of the cells in the array as described above.

Thus, unit 112 begins again by applying the row reset voltage $V_{RR1}$ to row reset line RR1 at time $t_{11}$, followed by the application of the series of column reset voltages $V_{CR1}$–$V_{CRm}$ to the column reset lines CR1–CRm, respectively, at time $t_{12}$. Once the cells 110 in the first row have been reset, unit 112 repeats these steps for each row in the array.

Following this, unit 112 again determines the initial integration voltage on each of the cells 110 in the first row by applying the row select voltage $V_{RS1}$ to row select line RS1 at a time $t_{13}$, which occurs immediately after the falling edge of the column reset voltages $V_{CR1}$–$V_{CRm}$. Once the cells 110 in the first row have been measured, unit 112 repeats these steps for each row in the array.

Thus, an imaging system has been described that samples the cells of the array multiple times during each integration cycle. The advantage of sampling each of the cells 110 in the array multiple times is that the dynamic range of the imaging system can be significantly increased.

As shown in FIG. 5, the total collected photon value for cell C1 far exceeds the pixel fill limit (the maximum capacity) of the cell. If this photon information were not summed up in memory, as is conventionally the case, all of the photon information in excess of the pixel fill limit would be lost.

FIGS. 6A–6E show timing diagrams that illustrate an alternate operation of imaging system 100 with respect to the cells 110 in the first row of the array in accordance with the present invention.

As noted above, once the digitized third integration voltages for each of the cells 110 in the first row have been output, unit 112 subtracts the digitized third integration voltage of each cell 110 in the first row from its digitized initial integration voltage to obtain a third collected photon value for each cell 110 in the first row.

As discussed in METHOD FOR OPERATING AN ACTIVE PIXEL SENSOR CELL THAT REDUCES NOISE IN THE PHOTO INFORMATION EXTRACTED FROM THE CELL, filed on even date herewith by Richard Merrill, which is hereby incorporated by reference, unit 112 can subtract the digitized third integration voltage of each cell 110 in the first row from its digitized initial integration voltage taken at the beginning of the second image collection cycle.

Thus, as shown in FIGS. 6A–6E, rather than subtracting the digitized values of cells C1–C3 obtained at time $t_4$ from the values obtained at time $t_3$, unit 112 subtracts the digitized values of cells C1–C3 obtained at time $t_4$ from the values obtained at time $t_{13}$.

The advantage of reading a cell 110, such as cell C3, immediately before and after the cell has been reset is that the time between successive reads can be reduced from approximately 30 mS (from the beginning to the end of the integration cycle) to approximately 10 $\mu$S (from the end of one integration cycle to the beginning of the next integration cycle). Significant results can also be obtained for cells C1–C2 by reducing the time between successive reads from approximately 10 mS to approximately 10 $\mu$S. As a result, variations in the voltage on the second intermediate node $N_{IM2}$ due to the threshold voltage variations of buffer transistor 16 that result from 1/f noise can also be substantially reduced.

In addition, as further shown in FIGS. 6A–6E, further reductions in the threshold voltage variations due to 1/f noise can be made by reading the voltage on the cell at times $t_{14}$ and $t_{15}$. Thus, the collected photons on cell C1 can be determined by subtracting the digitized value obtained at time $t_5$ from the value obtained at time $t_{14}$. Similarly, the number of collected photons on cells C1 and C2 can be determined by subtracting the digitized value obtained at time $t_8$ from the value obtained at time $t_{15}$.

With the method shown in FIGS. 6A–6E, an initial measurement must still be made with the digitized value obtained at time $t_3$ to first determine if the cell is going to be reset at all. Thus, the collected photons on cell C1 will only be determined by subtracting the digitized value obtained at time $t_5$ from the value obtained at time $t_{14}$ after a determination has been made that cell C1 will be reset by subtracting the digitized value obtained at time $t_5$ from the value obtained at time $t_3$.

Further, the magnitudes of the row and column reset voltages $V_{RR}$ and $V_{CR}$ are preferably set to be sufficiently greater than the voltage on the power supply nodes $N_{PS}$ of the cells 110 so that the voltages on the first intermediate nodes $N_{IM1}$ of the cells 110 are pulled up to the voltage on the power supply nodes $N_{PS}$.

For example, by placing 3.3 volts on the power supply node $N_{PS}$ of a cell 110, and by using 5-volt row and column reset voltages $V_{RR}$ and $V_{CR}$, the split-gate reset transistor 124 of a cell 110 is forced to operate in the linear region which, in turn, pulls up the voltage on the first intermediate node $N_{IM1}$ of the cell 110 to 3.3 volts.

The advantage of forcing the split-gate reset transistor 124 into the linear region of operation during reset is that the voltage on the first intermediate node $N_{IM1}$ is no longer subject to any variation due to changes in the threshold voltage of reset transistor 124 that result from 1/f noise. Alternately, the row and column reset voltages $V_{RR}$ and $V_{CR}$ can be set to be equal to the voltage on the power supply nodes $N_{PS}$, e.g. +5 V.

The magnitudes of the row-select voltages $V_{RS1}$–$V_{RSn}$ are also set to be sufficiently greater than the maximum voltage on the second intermediate nodes $N_{IM2}$ of the cells 110, such as five volts, so that the voltages on the cell output lines CO will track the voltages on the second intermediate nodes $N_{IM2}$.

As a result, the row-select transistors 128 of the cells 110 will not contribute a significant amount of noise since transistors 128 will also operate in the linear region which is not subject to $V_T$ variation. In addition, no current (other than a transient) will flow through transistors 126 and 128 when the row-select voltages $V_{RS}$ are applied because the loads in detection circuits DC1–DCm are capacitive.

Figure 7:
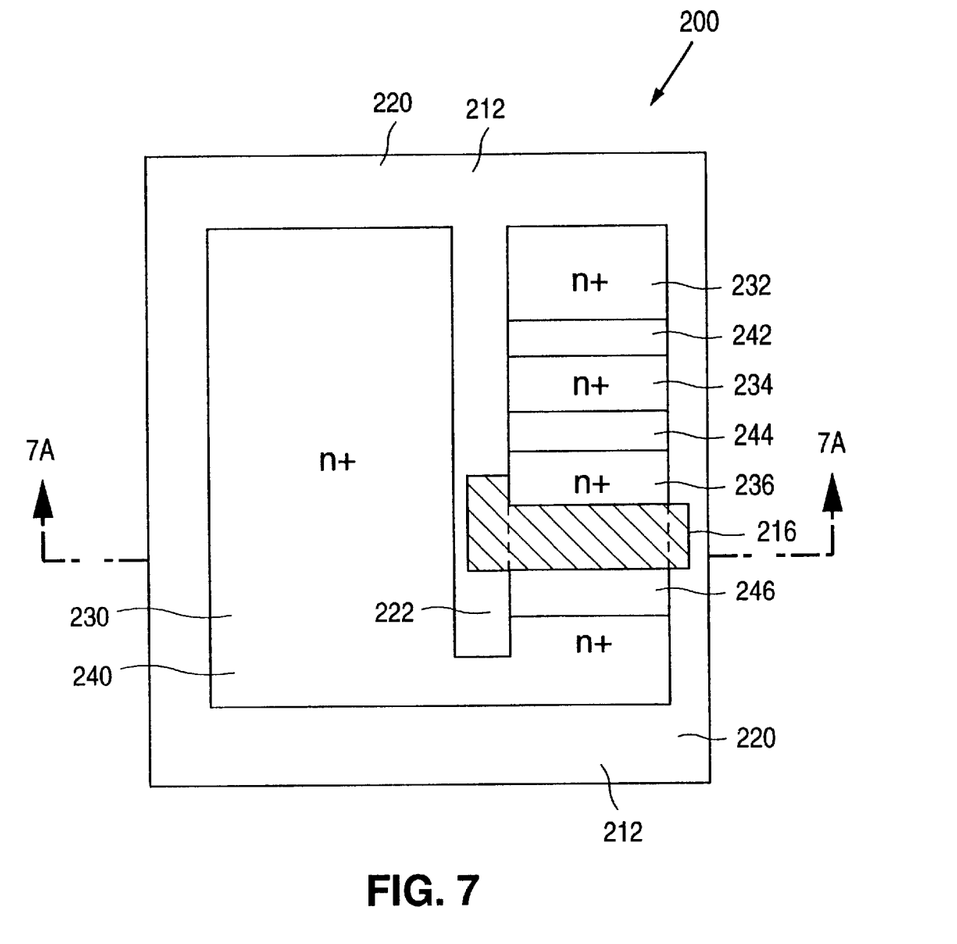
FIG. 7 is a plan view illustrating a first level of a layout of an active pixel sensor cell 200 that implements the schematic representation of cell 110 in FIG. 3 in accordance with the present invention.
Figure 8:
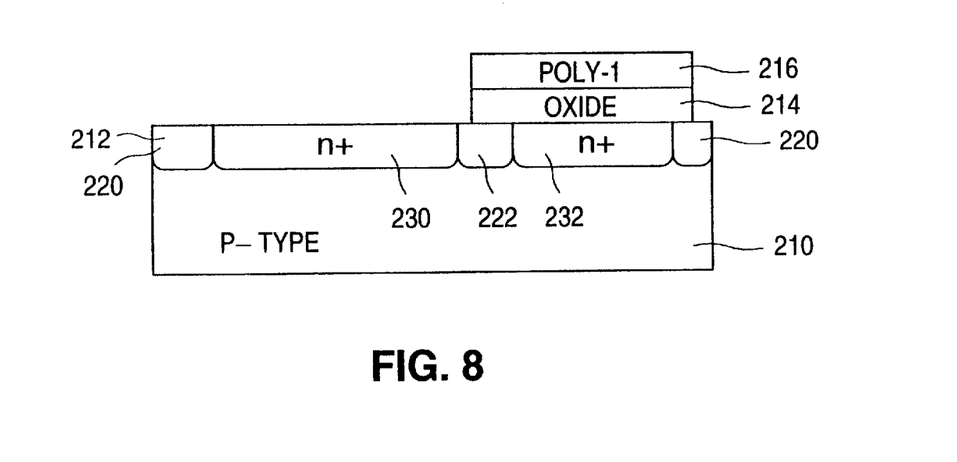
FIG. 8 is a cross-sectional view taken along line 7A—7A of FIG. 7.

FIG. 7 shows a plan view that illustrates a first level of a layout of an active pixel sensor cell 200 that implements the schematic representation of cell 110 in FIG. 3 in accordance with the present invention. FIG. 8 shows a cross-sectional view taken along line 7A—7A of FIG. 7.

As shown in FIGS. 7 and 8, cell 200 is formed on a substrate 210 that includes a trench isolation region 212 defined by an outer wall portion 220 that encloses a plurality of active regions within substrate 210, and a protruding wall portion 222 that extends inward from the outer wall portion 220. Alternately, isolation region 212 can be formed as field oxide regions by the local oxidation of silicon (LOCOS) or other well-known methods.

As further shown in FIGS. 7 and 8, the protruding wall portion 222 divides the plurality of active regions into an L-shaped first active region 230, and rectangularly-shaped second, third, and fourth active regions 232, 234, and 236. The first active region 230 of substrate 210 is doped with an n-type material to form an n+ photodiode 240, while the second, third, and fourth active regions 232, 234, and 236 are doped with an n-type material to form n+ source and drain regions for the transistors of cell 200.

Specifically, with reference to FIGS. 3 and 7, active region 232 functions as the source of row select transistor 128, active region 234 functions as the source of buffer transistor 126 and the drain of select transistor 128, and active region 236 functions as the drains for reset transistor 124 and buffer transistor 126.

In addition, the second and third active regions 232 and 234 are separated by a select channel region 242, the third and fourth active regions 234 and 236 are separated by a buffer channel region 244, and the first and fourth active regions 230 and 236 are separated by a split-gate reset channel region 246.

As further shown in FIGS. 7 and 8, active pixel sensor cell 200 further includes a first layer of polysilicon (poly-1) 216 and an underlying layer of oxide 214 that are formed over a first portion of the split-gate reset channel region 246 and a portion of the outer and protruding wall sections 220 and 222 of isolation region 212.

Figure 9:
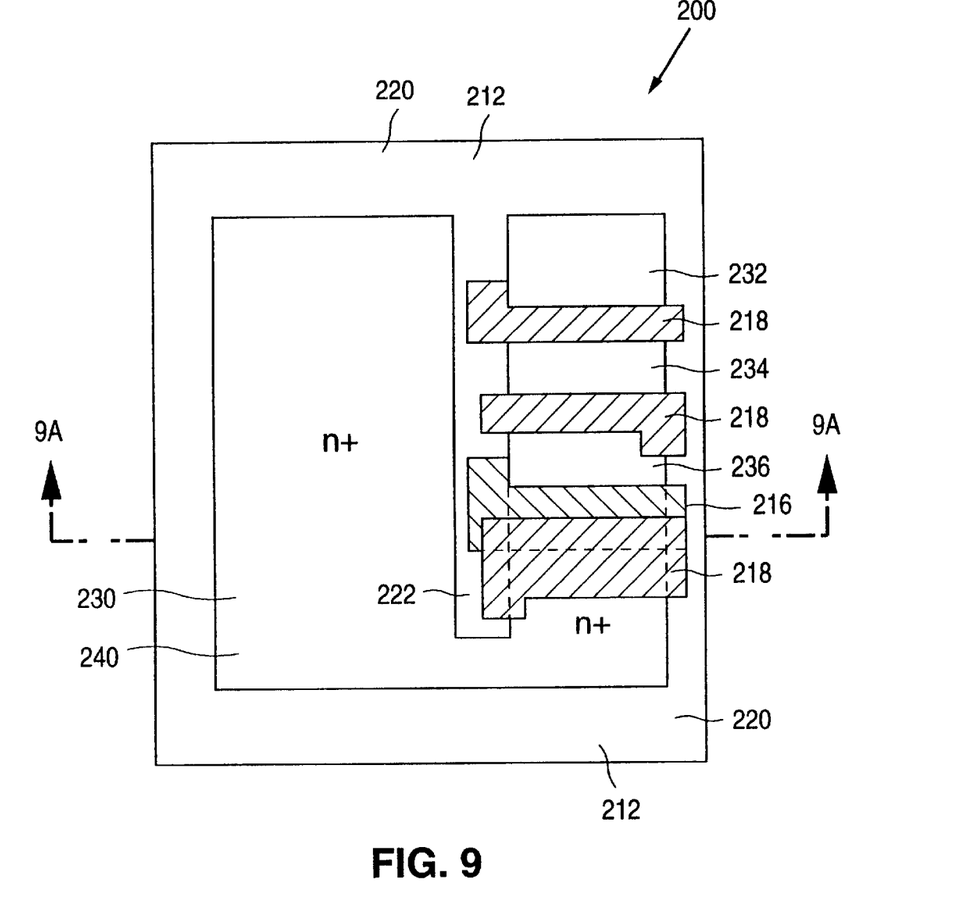
FIG. 9 is a plan view illustrating a second level of a layout of active pixel sensor cell 200 in accordance with the present invention.
Figure 10:
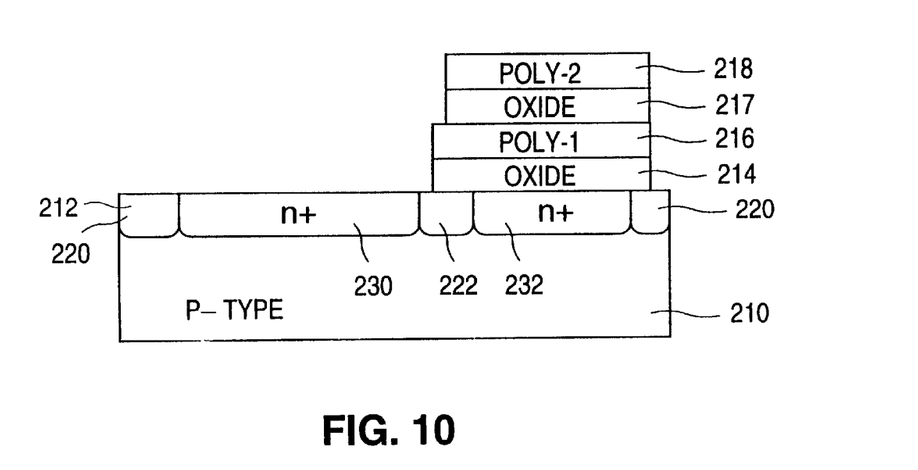
FIG. 10 is a cross-sectional view taken along line 9A—9A of FIG. 9.

FIG. 9 shows a plan view that illustrates a second level of a layout of active pixel sensor cell 200 in accordance with the present invention. FIG. 10 shows a cross-sectional view taken along line 9A—9A of FIG. 9.

As shown in FIGS. 9 and 10, active pixel sensor cell 100 further includes a second layer of polysilicon (poly-2) 218 and an underlying layer of oxide 217 that are formed over a second portion of the split-gate reset channel region 246 and a portion of the outer and protruding wall sections 220 and 222 of isolation region 212.

In addition, poly-2 layer 218 and the underlying layer of oxide 217 are also formed over the buffer channel region 244 and a portion of the outer and protruding wall sections 220 and 222 of isolation region 212, and the select channel region 242 and a portion of the outer and protruding wall sections 220 and 222 of isolation region 212.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An imaging system comprising:
   an array of active pixel sensor cells arranged in a number of rows and a number of columns;
   a plurality of detection circuits corresponding to the number of columns;
   an array controller and memory unit;
   a plurality of row select lines connected to the array and the array controller and memory unit so that each row select line is connected to each of the cells in a row of active pixel sensor cells;
   a plurality of row reset lines connected to the array and the array controller and memory unit so that each row reset line is connected to each of the cells in a row of active pixel sensor cells;
   a plurality of column reset lines connected to the array and the array controller and memory unit so that each column reset line is connected to each of the cells in a column of active pixel sensor cells;
   a plurality of cell output lines connected to the array and the detection circuits so that each cell output line is connected to each of the cells in a column of active pixel sensor cells and to a detection circuit that corresponds with the column of cells; and
   a plurality of detection output lines connected to the detection circuits and the array controller and memory unit so that each detection output line is connected to a detection circuit.

2. The imaging system of claim 1 wherein each of the cells comprise:
   a reset transistor connected to a power supply node, a first intermediate node, a row reset line, and a column reset line;

a photon collector connected to the first intermediate node;

a buffer transistor connected to the power supply node, a second intermediate node, and the first intermediate node; and a row select transistor connected to the second intermediate node, a row select line, and a cell output line.

3. The imaging system of claim 2 wherein the reset transistor includes a split-gate transistor.

4. The imaging system of claim 2 wherein the photon collector includes a photodiode.

5. The imaging system of claim 1 wherein each detection circuit receives a cell output voltage from a cell output line, amplifies and digitizes the cell output voltage, and outputs the digitized output voltage on a detection circuit output line.

6. The imaging system of claim 1 wherein the array controller and memory unit selectively activates the column reset lines in response to information from the detection output lines.

7. An imaging system comprising:

a plurality of active pixel sensor cells arranged in rows and columns, each active pixel sensor cell collecting photons and converting the collected photons into a charge value;

a plurality of row select lines connected to the active pixel sensor cells so that each row select line is connected to each of the cells in a row of active pixel sensor cells, the row select lines conducting a row select signal;

a plurality of row reset lines connected to the active pixel sensor cells so that each row reset line is connected to each of the cells in a row of active pixel sensor cells, the row reset lines conducting a row reset signal;

a plurality of column reset lines connected to the active pixel sensor cells so that each column reset line is connected to each of the cells in a column of active pixel sensor cells, the column reset lines conducting a column reset signal;

an array controller and memory unit connected to the row select lines, the row reset lines, and the column reset lines that selectively activates the row reset lines and the column reset lines to reset the active pixel sensor cells which have a charge value that exceeds a predetermined limit.

8. The imaging system of claim 7 wherein each of the cells comprise:

a reset transistor connected to a power supply node, a first intermediate node, a row reset line, and a column reset line;

a photon collector connected to the first intermediate node;

a buffer transistor connected to the power supply node, a second intermediate node, and the first intermediate node; and a row select transistor connected to the second intermediate node, a row select line, and a cell output line.

9. The imaging system of claim 8 wherein the reset transistor includes a split-gate transistor.

10. An imaging system comprising:

a plurality of active pixel sensor cells arranged in rows and columns, each active pixel sensor cell collecting photons and converting the collected photons into a charge value;

a plurality of row select lines connected to the active pixel sensor cells so that each row select line is connected to each of the cells in a row of active pixel sensor cells, the row select lines conducting a row select signal;

a plurality of row reset lines connected to the active pixel sensor cells so that each row reset line is connected to each of the cells in a row of active pixel sensor cells, the row reset lines conducting a row reset signal;

a plurality of column reset lines connected to the active pixel sensor cells so that each column reset line is connected to each of the cells in a column of active pixel sensor cells, the column reset lines conducting a column reset signal;

an array controller and memory unit connected to the row select lines, the row reset lines, and the column reset lines that determines the charge value on each cell a plurality of times during an integration period, stores the charge value each time the charge value exceeds a predetermined limit during the integration period, and resets the charge value each time the charge value is stored by selectively outputting the row reset and column reset signals on the row reset and column reset lines.

11. The imaging system of claim 10 wherein each of the cells comprise:

a reset transistor connected to a power supply node, a first intermediate node, a row reset line, and a column reset line;

a photon collector connected to the first intermediate node;

a buffer transistor connected to the power supply node, a second intermediate node, and the first intermediate node; and a row select transistor connected to the second intermediate node, a row select line, and a cell output line.

12. The imaging system of claim 11 wherein the reset transistor includes a split-gate transistor.

13. The imaging system of claim 12 wherein, at the end of the integration period, the array controller and memory unit, for each active pixel sensor cell, stores the charge value to form a stored charge value, and combines the stored charge value with any charge value previously stored during the integration period.

* * * * *